(12) United States Patent
Ootsuka

(10) Patent No.: US 10,948,126 B2
(45) Date of Patent: Mar. 16, 2021

(54) HAND-HELD DEVICE

(71) Applicant: FANUC CORPORATION, Yamanashi (JP)

(72) Inventor: Yuuma Ootsuka, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/278,968

(22) Filed: Feb. 19, 2019

(65) Prior Publication Data
US 2019/0264863 A1 Aug. 29, 2019

(30) Foreign Application Priority Data
Feb. 23, 2018 (JP) .............................. JP2018-030920

(51) Int. Cl.
F16M 13/00 (2006.01)
H01F 7/02 (2006.01)
B23H 1/00 (2006.01)
F16M 13/02 (2006.01)
H05K 5/02 (2006.01)
H05K 5/00 (2006.01)

(52) U.S. Cl.
CPC .............. F16M 13/005 (2013.01); B23H 1/00 (2013.01); F16M 13/022 (2013.01); H01F 7/0252 (2013.01); H05K 5/0204 (2013.01); H05K 5/0017 (2013.01)

(58) Field of Classification Search
CPC ...... F16M 13/005; F16M 13/022; B23H 1/00; H01F 7/0252; H05K 5/0204; H05K 5/0017

USPC ................... 248/683, 467, 537, 205.5, 309.4
See application file for complete search history.

(56) References Cited

U.S. PATENT DOCUMENTS

| 2,240,035 | A |   | 4/1941  | Catherall  |               |
|-----------|---|---|---------|------------|---------------|
| 2,414,653 | A |   | 1/1947  | Lookholder |               |
| 2,457,421 | A | * | 12/1948 | Warren     | B43M 99/009   |
|           |   |   |         |            | 335/285       |
| 3,009,225 | A | * | 11/1961 | Budreck    | H01F 7/0252   |
|           |   |   |         |            | 24/303        |
| 3,992,689 | A | * | 11/1976 | Kaplow     | H01F 7/0252   |
|           |   |   |         |            | 335/302       |

(Continued)

FOREIGN PATENT DOCUMENTS

| CN | 201075245 Y | 6/2008 |
|----|-------------|--------|
| CN | 203015304 U | 6/2013 |

(Continued)

OTHER PUBLICATIONS

Chinese search report, issued in Chinese Application No. 201910133169.7, including English Machine Translation, 4 total pages.

Primary Examiner — Muhammad Ijaz
(74) Attorney, Agent, or Firm — Robert P. Michal, Esq.; Carter, DeLuca & Farrell LLP

(57) ABSTRACT

A hand-held device is a portable device configured to be attached to and detached from a metal board, and includes a casing and a magnet disposed inside the casing so as to be attracted to the metal board via an attachment face of the casing. The hand-held device further includes an urging element for urging the magnet so that the magnet moves in a direction away from the attachment face when the casing is detached from the metal board.

6 Claims, 6 Drawing Sheets

(56) References Cited

U.S. PATENT DOCUMENTS

| | | | | |
|---|---|---|---|---|
| 8,016,255 | B2* | 9/2011 | Lin | G06F 1/1607 |
| | | | | 248/206.5 |
| 2016/0003270 | A1* | 1/2016 | Franklin | H01F 7/0221 |
| | | | | 439/529 |
| 2019/0069702 | A1* | 3/2019 | Laslo | A47K 3/281 |
| 2019/0262921 | A1* | 8/2019 | Ootsuka | B25H 3/04 |
| 2019/0264863 | A1* | 8/2019 | Ootsuka | F16M 13/022 |
| 2019/0327843 | A1* | 10/2019 | Chang | H05K 5/0247 |
| 2020/0037790 | A1* | 2/2020 | Veltz | A47G 1/17 |

FOREIGN PATENT DOCUMENTS

| | | | |
|---|---|---|---|
| CN | 109121328 | A | 1/2019 |
| JP | S59-084504 | A | 5/1984 |
| JP | H01295161 | A | 11/1989 |
| JP | 2004193532 | A | 7/2004 |
| JP | 2006-198762 | A | 8/2006 |
| JP | 2009-067489 | A | 4/2009 |
| JP | 2011-001718 | A | 1/2011 |
| JP | 2011-231550 | A | 11/2011 |
| JP | 3181269 | U | 1/2013 |
| JP | 2016013032 | A | 1/2016 |
| JP | 2016175385 | A | 10/2016 |

\* cited by examiner

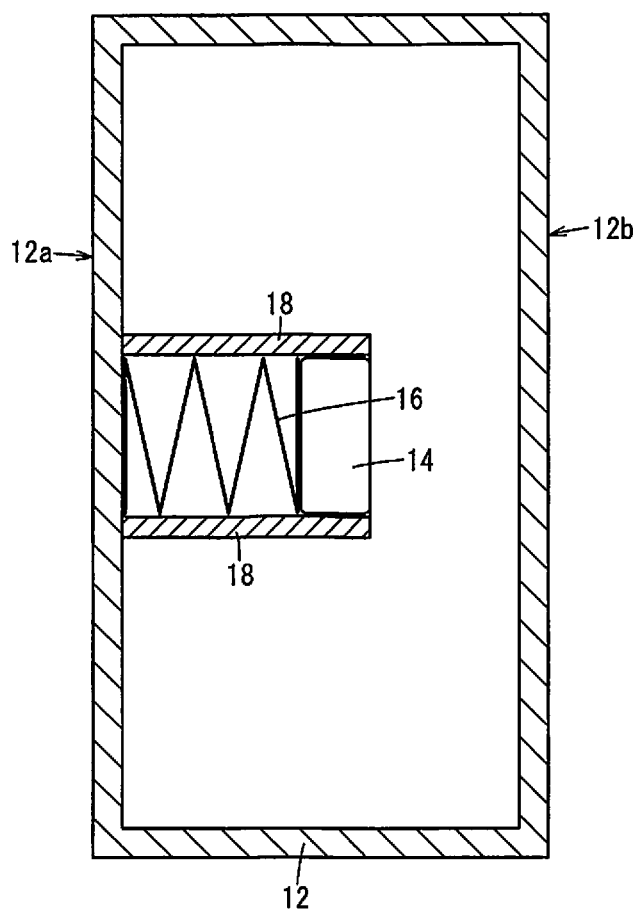

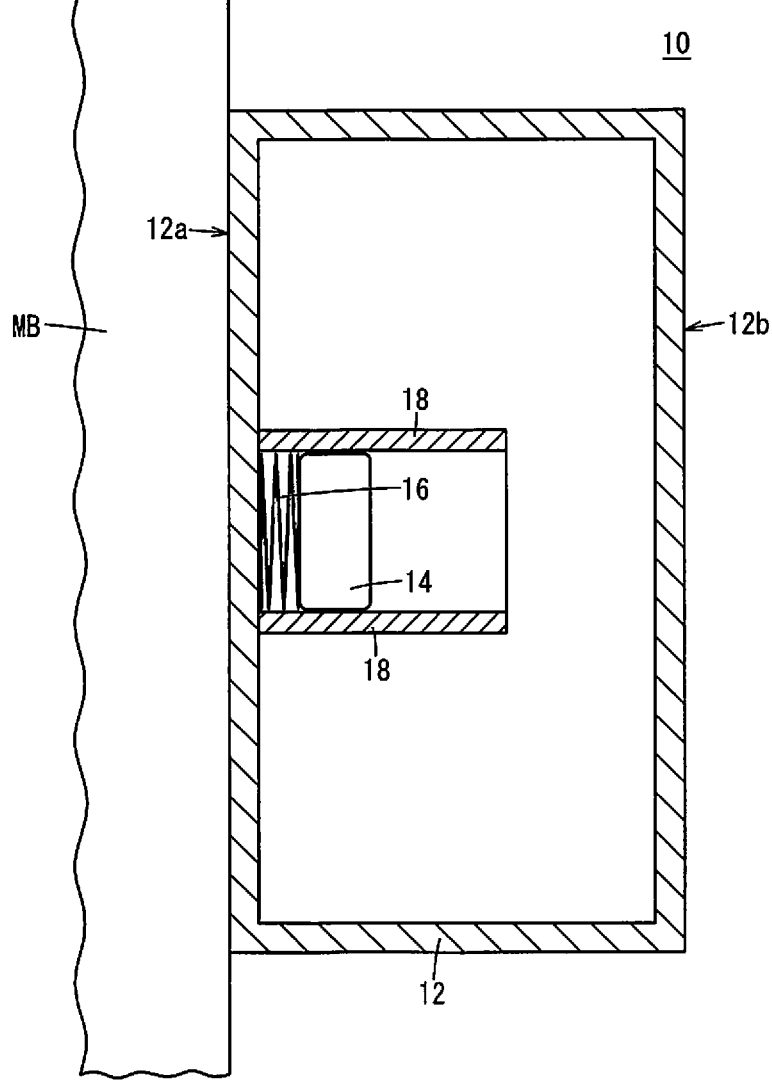

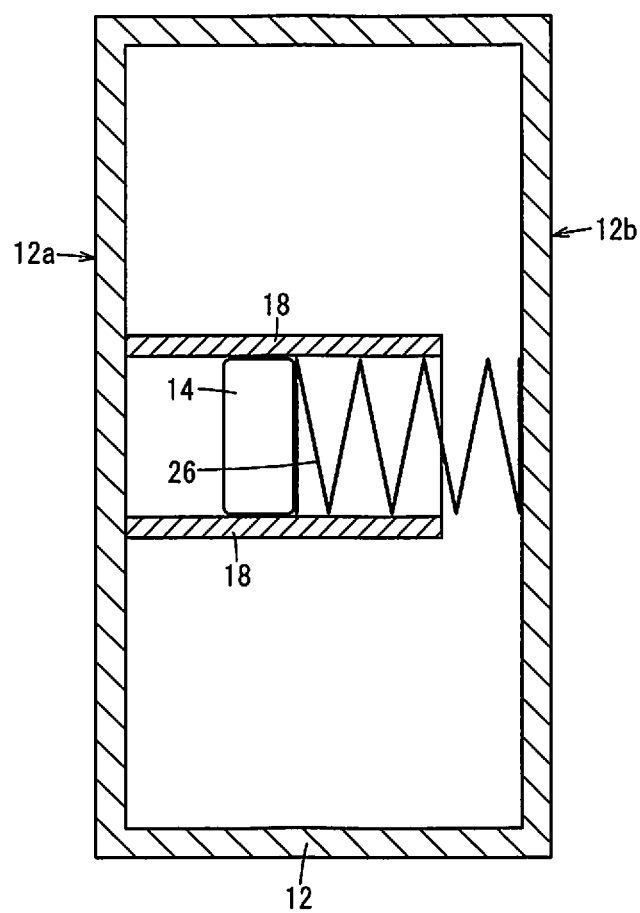

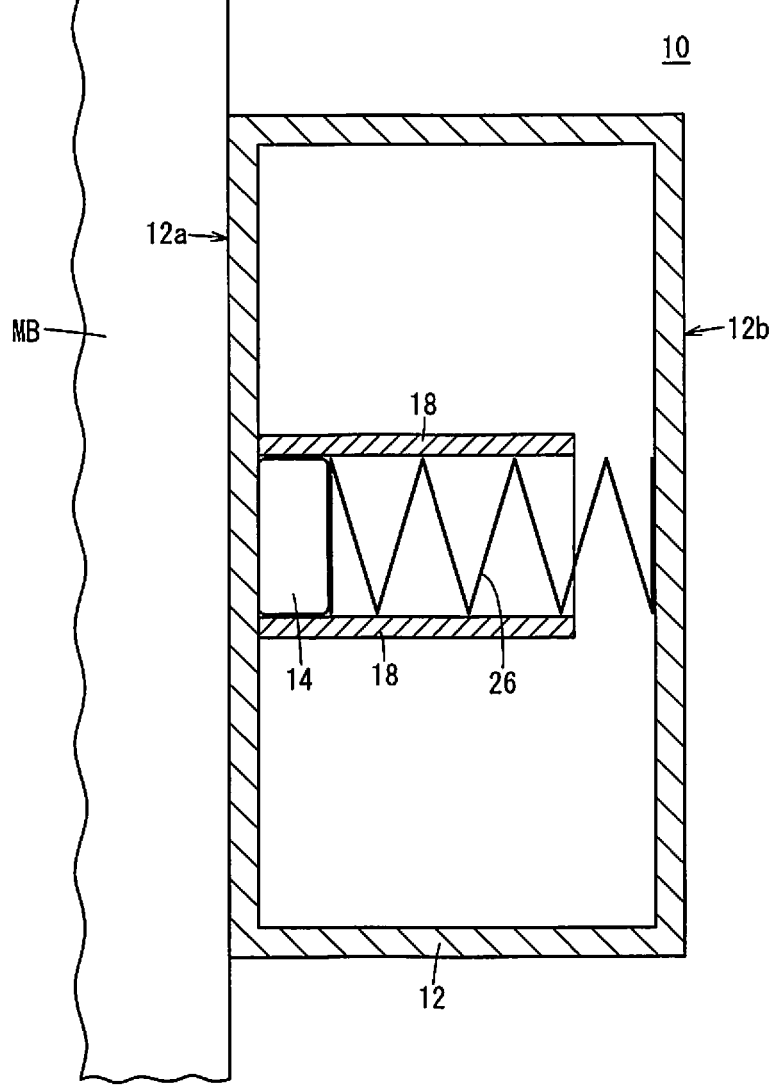

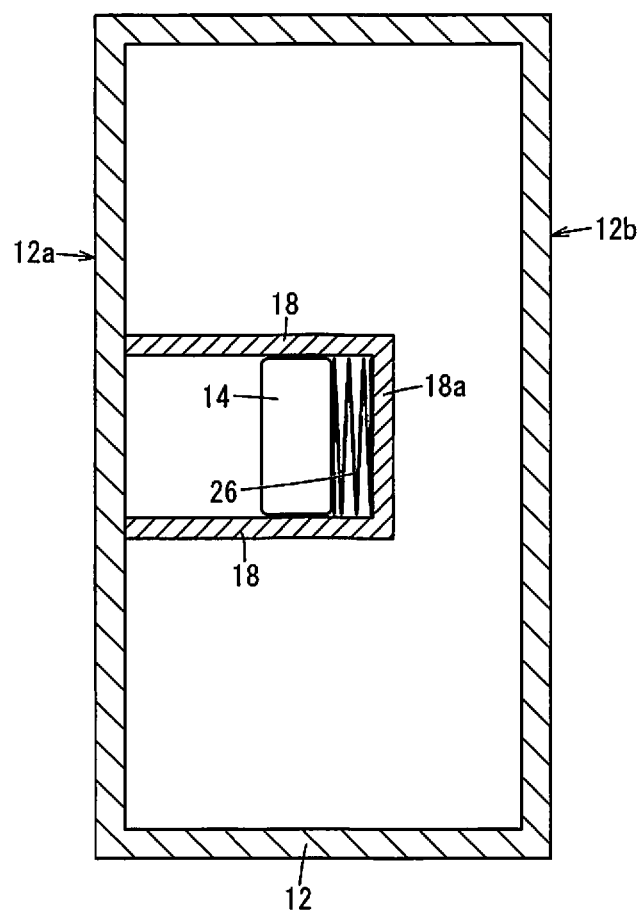

HAND-HELD DEVICE

CROSS-REFERENCE TO RELATED APPLICATION

This application is based upon and claims the benefit of priority from Japanese Patent Application No. 2018-030920 filed on Feb. 23, 2018, the contents of which are incorporated herein by reference.

BACKGROUND OF THE INVENTION

Field of the Invention

The present invention relates to a portable hand-held device that is attachable to and detachable from a metal board.

Description of the Related Art

As a portable hand-held device, for example, an operation device such as a remote controller can be mentioned, and a magnet is used to make such an operation device attachable to and detachable from a metal board. For example, Japanese Laid-Open Patent Publication No. 2011-001718 discloses a detachable structure for a remote controller that performs remote control. This structure uses a magnet to allow the remote controller to be detachably fixed to a wall by the magnetic force of the magnet.

SUMMARY OF THE INVENTION

Meanwhile, in factories and others equipped with a machine tool, there are some cases in which when an operation device for operating the machine tool is not used, the device is attracted to a metal board such as a metal base on which the machine tool is mounted, by a magnet provided on the operation device side.

However, metal chips such as metal pieces and metal powder generated during the machining of the machine tool or the like may stick to the casing of the operation device by the magnetic force of the magnet, and when the device with the metal chips sticking thereto is attached to the metal board, the metal board is liable to be scratched. Further, the task of removing metal chips sticking to the casing of the operation device therefrom tends to be troublesome.

It is therefore an object of the present invention to provide a hand-held device capable of preventing adhesion of metal chips.

An aspect of the present invention resides in a portable hand-held device configured to be attached to and detached from a metal board, including: a casing; a magnet disposed inside the casing so as to be attracted to the metal board via an attachment face of the casing; and an urging element configured to urge the magnet so that the magnet moves in a direction away from the attachment face when the casing is detached from the metal board.

In accordance with the hand-held device having the above aspect, when the casing is detached from the metal board, the magnet provided inside the casing is separated from the attachment face of the casing by action of the urging element. Therefore, it is possible to prevent metal chips from being magnetically attracted to the casing by the magnetic force of the magnet. As a result, according to the hand-held device of the above aspect, adhesion of metal chips can be prevented.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 2 is a sectional view showing a hand-held device being detached from a metal board;

FIG. 3 is a sectional view showing a hand-held device attached to a metal board;

FIG. 4 is a sectional view showing a hand-held device including an urging element of modification 1, viewed from the same viewpoint as in FIG. 2;

FIG. 5 is a sectional view showing a hand-held device including an urging element of the modification 1 viewed from the same viewpoint as in FIG. 3; and FIG. 6 is a sectional view showing a hand-held device of modification 2, viewed from the same viewpoint as in FIG. 4.

DESCRIPTION OF THE PREFERRED EMBODIMENTS

Figure 1:
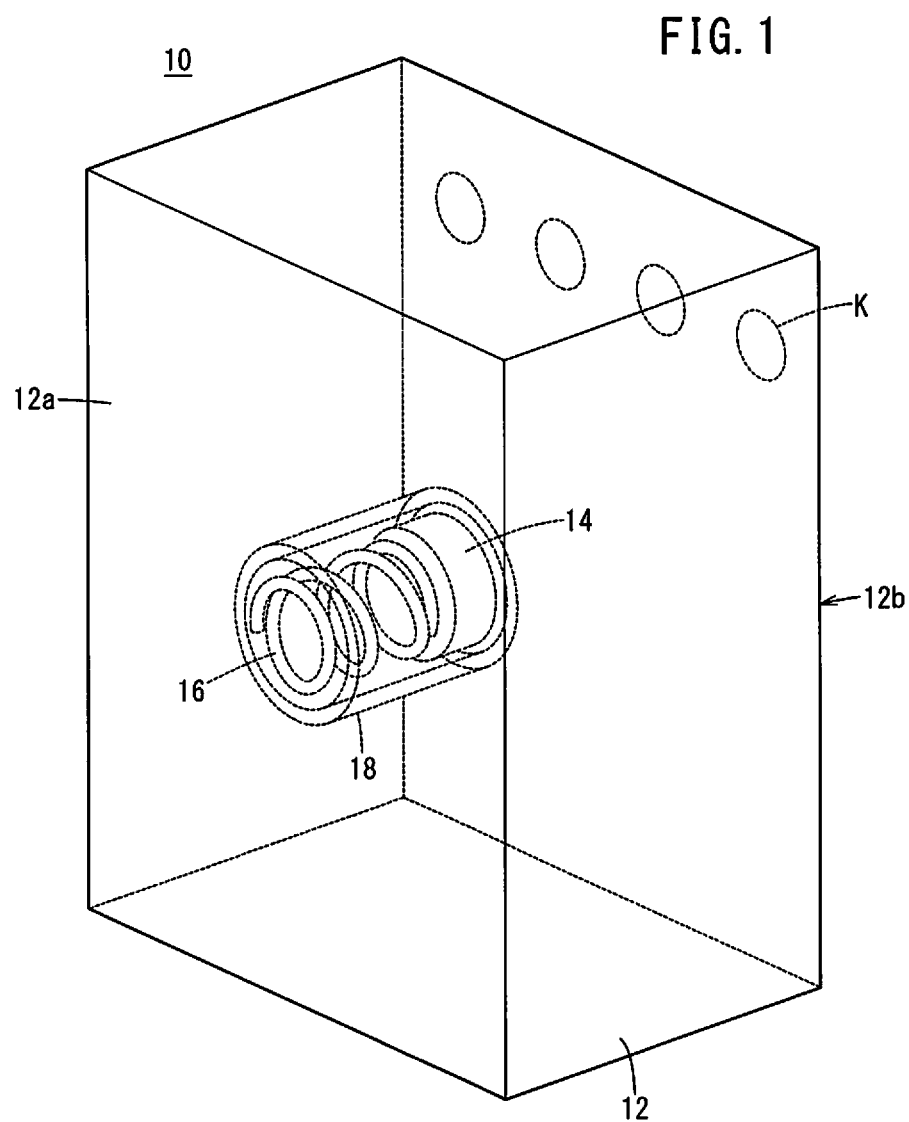
FIG. 1 is a schematic perspective view showing a hand-held device according to an embodiment.

Hand-held devices according to the present invention will be detailed below by describing preferred embodiments with reference to the accompanying drawings.

FIG. 1 is a schematic perspective view of a hand-held device 10. The hand-held device 10 is a portable device that is attachable to and detachable from a metal board MB (see FIG. 3). In the present embodiment, the hand-held device 10 is an operation device for operating a machine tool such as a cutting device for cutting a workpiece using a tool and an electrical discharge machine for performing electrical discharge machining on a workpiece, and can be attached to and detached from the metal board MB such as a metal base on which the machine tool is mounted.

The hand-held device 10 mainly includes a casing 12, a magnet 14, an urging element 16 and a guide portion 18. The casing 12 is a hollow container having an attachment face 12a. The attachment face 12a is a surface of a casing wall of the casing 12 that is attached to the metal board MB. The casing 12 of the present embodiment has an operation panel 12b on the side opposite to the attachment face 12a. For example, a plurality of operation keys K for operating the machine tool are arranged on the operation panel 12b.

The magnet 14 attracts the metal board MB and is arranged inside the casing 12. The magnet 14 of the present embodiment is a disk-shaped permanent magnet, and is arranged so as to be movable inside the casing 12 in a direction away from the attachment face 12a and in a direction approaching the attachment face 12a.

The urging element 16 urges the magnet 14 so that the magnet 14 moves in the direction away from the attachment face 12a of the casing 12 when the casing 12 is detached from the metal board MB. FIG. 2 is a sectional view showing the hand-held device 10 being detached from the metal board MB. FIG. 3 is a sectional view showing the hand-held device 10 attached to the metal board MB.

The urging element 16 of the present embodiment is a compression spring that is arranged in the casing 12 and connected between the magnet 14 and a casing wall of the casing 12 that is attached to the metal board MB. The urging force (the spring force of the compression spring) of the urging element 16 is smaller than the attraction force of the magnet 14.

That is, the urging element 16 (compression spring) has a natural length in a state where the casing 12 is detached from the metal board MB (see FIG. 2), and is compressed when the magnet 14 is attracted to the metal board MB and the casing 12 is attached to the metal board MB (see FIG. 3). In FIGS. 2 and 3, the compression spring are illustrated with lines for convenience.

The guide portion 18 guides a movement path of the magnet 14, and is provided inside the casing 12. The guide portion 18 guides the magnet 14 along the movement path, and thus the guide portion 18 can guide the magnet 14 to a desired position when the casing 12 is detached from the metal board MB.

The guide portion 18 of the present embodiment is, for example, cylindrical and is provided so as to surround the entire periphery of the movement path of the magnet 14 (see FIG. 1). By surrounding the entire circumference of the movement path of the magnet 14, the guide portion 18 can prevent contact of the magnet 14 with components such as electronic parts disposed inside the casing 12. The guide portion 18 may be a yoke.

Next, the operation of the urging element 16 will be described. In a detached state (see FIG. 2) where the casing 12 is detached from the metal board MB, the urging element 16 (compression spring) is in a state of natural length, and the magnet 14 is located at a first position away from the attachment face 12a of the casing 12.

The distance from the attachment face 12a to the first position is designed to be such a distance that magnetic force of the magnet 14 does not attract metal chips to the attachment face 12a of the casing 12 and can attract the hand-held device to the metal board MB when the attachment face is brought close to the metal board. Specifically, this distance is determined based on various parameters such as the shape, material, area, thickness and attraction force of the magnet 14, and the shape, material and urging force of the urging element 16. Here, the magnet 14 may be provided with a yoke.

When the attachment face 12a of the casing 12 is brought close to the metal board MB from its detached state, the magnet 14 starts to attract the metal board MB, so that the pressing force for pressing against the urging element 16 (compression spring) arises. Since the spring force of the urging element 16 (compression spring) is smaller than the attraction force of the magnet 14 as described above, the magnet 14 moves away from the first position and toward a second position on the attachment face 12a side, so that the urging element 16 (compression spring) is compressed by this movement. When the magnet 14 moves to the second position and comes into contact with the back surface of the attachment face 12a, the urging element 16 (compression spring) is kept in a compressed state (see FIG. 3).

At this point, when the casing 12 is detached from the metal board MB and attraction of the magnet 14 is released, the urging element 16 (compression spring) returns from the compressed state (see FIG. 3) to the natural length state (see FIG. 2), whereby the magnet 14 moves from the second position to the first position.

Thus, with the hand-held device 10, when the casing 12 is removed from the metal board MB, the magnet 14 provided inside the casing 12 is separated from the attachment face 12a of the casing 12 by the urging element 16. Therefore, the hand-held device 10 can prevent metal chips from being magnetically attracted to the casing 12 due to the magnetic force of the magnet 14. As a result, adhesion of metal chips can be prevented.

MODIFICATIONS

Although the above embodiment has been described as an example of the present invention, the technical scope of the present invention should not be limited to the scope described in the above embodiment. It goes without saying that various modifications or improvements can be added to the above embodiment. It is obvious from the description of the scope of the claims that modes with such modifications or improvements can be included in the technical scope of the present invention.

Part of the modified or improved forms will be described below as modifications. Note that the same reference numerals are given to the same components as those described in the above embodiment, and repeated explanation is omitted.

Modification 1

FIG. 4 is a sectional view showing a hand-held device 10 including an urging element 26 of modification 1, viewed from the same viewpoint as in FIG. 2. FIG. 5 is a sectional view showing the hand-held device 10 including the urging element 26 of the modification 1, viewed from the same viewpoint as in FIG. 3. The hand-held device 10 of the modification 1 is different from the hand-held device 10 of the above embodiment by inclusion of the urging element 26 instead of the urging element 16 of the above embodiment.

The urging element 26 is a tension spring connected between a casing wall on the operation panel 12b side and the magnet 14, and the urging force (the spring force of the tension spring) of the urging element 26 is smaller than the attraction force of the magnet 14. In FIGS. 4 and 5, the urging element 26 (tension spring) is illustrated by lines for convenience of explanation.

In the detached state (see FIG. 4) where the casing 12 is detached from the metal board MB, the urging element 26 (tension spring) is in a state of natural length. On the other hand, in the attached state (see FIG. 5) where the magnet 14 attracts the metal plate MB and the casing 12 is attached to the metal plate MB, the urging element 26 (tension spring) is pulled, i.e., in a tension state.

When the casing 12 is detached from the metal board MB from this attached state so that attraction of the magnet 14 is released, the urging element 26 (tension spring) returns from the tension state (see FIG. 5) to the natural length state (see FIG. 4), and then the magnet 14 moves from the second position to the first position.

In this way, even when the urging element 26 (tension spring) is adopted, when the casing 12 is detached from the metal board MB, the magnet 14 arranged inside the casing 12 is separated from the attachment face 12a of the casing 12 by the urging element 26, as in the above embodiment. Therefore, it is possible to prevent metal chips from being magnetically attracted to the casing 12 by the magnetic force of the magnet 14.

In the modification 1, the urging element 26 (tension spring) is not interposed between the first position and the second position, between which the magnet 14 moves. Therefore, as compared with the case of the above-described embodiment in which the urging element 16 (compression spring) is interposed between the first position and the second position, between which the magnet 14 moves, it is possible to shorten the distance between the metal board MB and the magnet 14, so that the casing 12 can be held more stably on the metal board MB.

Modification 2

FIG. 6 is a sectional view showing a hand-held device 10 of modification 2, viewed from the same viewpoint as in FIG. 4. The hand-held device 10 of the modification 2 is different from the hand-held device 10 of the modification 1 in that the hand-held device 10 of the modification 2 has a lid 18a that closes the opening of an end face of the guide portion 18 that is located on the operation panel 12b side, whereas the hand-held device 10 of the modification 1 does not have such a lid 18a.

The urging element 26 (tension spring) connects the lid 18a and the magnet 14 surrounded by the guide portion 18. In other words, the modification 2 is different from the modification 1 in that an end of the urging element 26 (tension spring) remote from the magnet 14 is connected to the lid 18a in the modification 2, whereas an end of the urging element remote from the magnet is connected to the casing wall located on the operation panel 12b side in the modification 1. That is, since the lid 18a in the modification 2 is located closer to the attachment face 12a of the casing 12 than the casing wall on the operation panel 12b side, it is possible to reduce the spring displacement of the urging element 26 (tension spring) compared to the case of the modification 1.

Modification 3

Though, in the above-described embodiment, the hand-held device 10 is an operation device for operating a machine tool, it may be an operation device for operating a machine, an appliance and the like other than machine tools. Further, the hand-held device 10 may be an electronic device not including operation keys K, or may be an appliance that does not include any electronic component. In short, the hand-held device 10 may be any device as long as it is of a portable type that can be attached to and detached from the metal board MB.

Modification 4

The above embodiment and modifications 1 to 3 may be arbitrarily combined as long as no inconsistency occurs.

Technical Ideas

Technical ideas that can be grasped from the above embodiment and modifications are described below.

A hand-held device (10) is a portable device configured to be attached to and detached from a metal board (MB), and includes a casing (12) and a magnet (14) disposed inside the casing (12) so as to be attracted to the metal board (MB) via an attachment face (12a) of the casing (12). The hand-held device (10) includes an urging element (16, 26) configured to urge the magnet (14) so that the magnet (14) moves in a direction away from the attachment face (12a) when the casing (12) is detached from the metal board (MB).

In accordance with this hand-held device (10), when the casing (12) is removed from the metal board (MB), the magnet (14) provided inside the casing (12) is separated from the attachment face (12a) of the casing (12) by action of the urging element (16, 26). Therefore, according to the hand-held device (10), it is possible to prevent metal chips from being magnetically attracted to the casing (12) by the magnetic force of the magnet (14). As a result, adhesion of metal chips can be prevented.

The urging force of the urging element (16, 26) may be smaller than the attraction force of the magnet (14). This makes it possible to keep the casing (12) attached to the metal board (MB) only by attraction of the magnet (14) to the metal board (MB).

The hand-held device (10) may further include a guide portion (18) provided inside the casing (12) and configured to guide the magnet (14) along a movement path. This makes it possible to stably guide the moving magnet (14) to a desired position when the casing (12) is detached from the metal board (MB).

The guide portion (18) may be configured to surround the entire periphery of the movement path of the magnet (14). This configuration can prevent contact of the magnet (14) with arranged components such as electronic parts arranged inside the casing (12).

The hand-held device (10) may be an operation device for operating a machine tool.

What is claimed is:

1. A portable hand-held device configured to be attached to and detached from a metal board, comprising:
    a casing including:
        a front attachment surface adapted to be attached to the metal board; and
        an operation panel for a machining tool, the operation panel being located on a side of the casing opposite to a side of the casing where the front attachment surface is;
    a magnet disposed inside the casing, the magnet being disposed between and spaced from both the front attachment surface and the operation panel of the casing when the metal board is detached from the casing, the magnet being attracted to the metal board via the front attachment surface of the casing;
    an urging element configured to urge the magnet so that the magnet moves in a direction away from the front attachment surface when the casing is detached from the metal board; and
    a guide portion provided inside the casing and configured to surround a movement path of the magnet,
    wherein the urging element is a spring arranged inside the guide portion.

2. The hand-held device according to claim 1, wherein urging force of the urging element is smaller than attraction force of the magnet.

3. The hand-held device according to claim 1, wherein the guide portion is configured to surround an entire periphery of the movement path of the magnet.

4. The hand-held device according to claim 1, wherein the hand-held device is an operation device for operating the machining tool.

5. The hand-held device according to claim 1, wherein the urging element exerts a resilient bias on the magnet in the direction away from the front attachment surface.

6. The hand-held device according to claim 5, wherein the magnet is enclosed by the casing and restricted from moving forward of the front attachment surface.

* * * * *